United States Patent [19]

Brar et al.

[11] Patent Number: 4,863,809
[45] Date of Patent: Sep. 5, 1989

[54] SURFACE TREATMENT FOR SLIDERS AND CARBON COATED MAGNETIC MEDIA

[75] Inventors: Amarjit S. Brar, Edina; Jagdish P. Sharma, Bloomington, both of Minn.

[73] Assignee: Magnetic Peripherals, Inc., Minneapolis, Minn.

[21] Appl. No.: 166,215

[22] Filed: Mar. 10, 1988

[51] Int. Cl.$^4$ ............................................. B32B 15/04
[52] U.S. Cl. .................................... 428/623; 428/626; 428/634; 428/653; 428/938; 427/34; 360/102
[58] Field of Search ............... 428/623, 624, 626, 634, 428/652, 653, 900; 427/34, 131, 132; 360/103, 102

[56] References Cited

U.S. PATENT DOCUMENTS

| | | | |
|---|---|---|---|
| Re. 32,464 | 7/1987 | Aine | 428/622 |
| 3,778,308 | 12/1973 | Roller et al. | 428/421 |
| 4,226,018 | 10/1980 | Nakanishi et al. | 29/603 |
| 4,251,297 | 2/1981 | Kawabata et al. | 148/121 |
| 4,589,043 | 5/1986 | Grundtner | 360/126 |
| 4,592,963 | 6/1986 | Mukasa et al. | 428/544 |
| 4,599,052 | 7/1986 | Langen et al. | 417/413 |
| 4,619,861 | 10/1986 | Nakayama et al. | 428/220 |
| 4,631,613 | 12/1986 | French | 360/125 |
| 4,638,387 | 1/1987 | Mukasa et al. | 360/122 |
| 4,649,448 | 3/1987 | Nakajima | 360/122 |
| 4,711,809 | 12/1987 | Nishikawa et al. | 427/131 |
| 4,749,608 | 6/1988 | Nakayama et al. | 427/131 |

FOREIGN PATENT DOCUMENTS 3743  1/1984  Japan ..................... 360/103

Primary Examiner—L. Dewayne Rutledge
Assistant Examiner—George Wyszomierski
Attorney, Agent, or Firm—Edward P. Heller, III; Frederick W. Niebuhr; Edward L. Schwarz

[57] ABSTRACT

An etching and fluorinating treatment is disclosed for modifying the surface properties of magnetic data storage media and sliders for magnetic data transducing heads. Media enclosed within a plasma chamber is first exposed to an argon plasma for cleaning, then exposed to a plasma mixture including argon with either fluorine or carbon tetrafluoride, maintained at a pressure of approximately half of atmospheric pressure, at a temperature of about 100° C. An electrical field is generated for forming argon, carbon and fluorine ions. The argon ions etch the carbon overcoat of the disc, while the carbon and fluorine ions combine with the carbon to form extended chain fluoropolymers, and also penetrate the carbon layer. Sliders are treated in a plasma mixture of argon and $CF_4$. During such treatment, carbon and fluorine ions penetrate exposed surface areas of the slider, and form a reaction product of solid lubricant film. In connection with both processes, ion penetration and reaction product formation reduce surface energy and strengthen cohesive bonding. The formation of a solid lubricant of extended chain fluoropolymers improves lubricity.

4 Claims, 2 Drawing Sheets

SURFACE TREATMENT FOR SLIDERS AND CARBON COATED MAGNETIC MEDIA

BACKGROUND OF THE INVENTION

This invention relates to magnetic data storage and retrieval apparatus, and more particularly to processes for improving the surface properties of magnetic discs or other media, and of sliders for magnetic reading and recording transducers.

The employment of selected surface coatings and other treatments is a well known technique for enhancing the useful life and reliability of magnetic media and sliders of magnetic data reading and recording heads. Magnetic discs and sliders are subject to wear along their interfaces or areas of mutual surface engagement as they are moved relative to one another. Even in disc drives employing "flying" heads which normally are separated from the disc by a thin air foil, the surface contact during repeated starts and stops of disc rotation can cause substantial wear to the interfacing surfaces, and eventually can lead to a head crash.

Accordingly, surfaces of sliders and discs frequently are treated to increase their toughness and strength, and to reduce friction. For example, in U.S. Pat. No. 4,251,297 (Kawabata) a boronized layer is formed on the surface portion of a slider disposed to contact the magnetic recording medium. U.S. Pat. No. 4,631,613 (French) discloses a plasma process for improving the saturization magnetization of the transducer. In particular, a gap spacer material and a pole piece are deposited using an Alfesil target along with either argon or nitrogen gas.

In connection with a device in which the slider is normally in contact with a magnetic tape or disc, a technique to improve the slideability between a disc and slider is disclosed in U.S. Pat. No. 4,649,488 (Nakajima). The sliding surface of a head is coated with a zirconium oxide or other material having a high coefficient of thermal expansion, in particular high enough to carbonize the binder of the recording medium.

U.S. Pat. No. 4,619,861 (Nakayama) discloses a plasma polymerization technique for coating the particle which make up magnetic powders. The technique is said to improve the disperseability, squareness ratio and dusting of the magnetic powders. Another known approach is to provide a passivation layer of sputtered carbon over the magnetic media or recording layer of a disc, both to protect the media layer against corrosion and to improve surface lubricity. The carbon overcoat is quite thin, typically in the range of 300 to 400 Angstroms, and as formed, includes micro-pores and sometimes "pinholes" exposing the media layer. Another problem encountered with the carbon overcoat is a build-up of debris, principally carbon particles, on the disc surface. The slider, due to high surface energy, tends to pick up this debris, leading ultimately to a head crash.

Therefore it is an object of the present invention to improve the lubricity, smoothness and wear characteristics in a carbon layer provided over the magnetic media layer of a magnetic disc or other medium.

Another object of the invention is to provide a slider with an interfacing surface of improved toughness, hardness and lubricating characteristics, and reduced surface energy.

Another object of the invention is to provide a process for surface treatment of magnetic media and sliders to improve their surface properties.

Yet another object is to provide magnetic media and sliders having reduced friction at their interface, thereby to reduce noise due to friction and increase signal quality.

SUMMARY OF THE INVENTION

To achieve these and other objects, there is provided a process for treating a carbon overcoated magnetic data storage medium, including the steps of:

(1) enclosing a magnetic recording medium within a plasma chamber, said medium including a substrate, a recording layer of magnetizable material formed over the substrate, and an outer layer consisting essentially of carbon formed over the recording layer;

(2) maintaining within the chamber an inert gas plasma at a first selected pressure substantially less than atmospheric pressure, generally at ambient temperature, and for a first selected amount of time to substantially clean exposed surfaces of the outer layer; and (3) following the plasma cleaning and with the medium in the chamber, maintaining within the chamber a plasma mixture at a second selected pressure substantially less than atmospheric pressure, generally at ambient temperature, and for a second selected amount of time to fluorinate at least a portion of the outer layer, wherein the plasma mixture consists essentially of a reactive gas and an inert gas, with the reactive gas comprising at least sixty percent, by volume, of the mixture and further consisting essentially of at least one of the following constituents: $CF_4$ and $F_2$.

Preferably, the fluorinating step is performed at a temperature of about 100° C. and at a pressure of approximately 300 millitorr, or somewhat less than one-thousandth of atmospheric pressure. A 600 watt power source creates the charge or voltage differential between a pair of electrodes associated with the plasma chamber.

The preferred inert gas is argon and the preferred reactive gas is carbon tetrafluoride ($CF_4$) A satisfactory range for the volume percentage of $CF_4$ is seventy-five to eighty-five percent of the plasma mixture, with a preferred percentage being eighty percent.

As a result of this process, the carbon layer of the treated medium becomes fluorinated, at least along its exposed surfaces. In particular, the reactive component of the plasma mixture combines with the carbon to form extended chain fluoropolymers or other polymeric solid lubricants, believed to include one or more of the following constituents: hexafluoroethane, tetrafluoroethylene, and tetrafluoropropylene. These constituents form a solid lubricant over the exposed surfaces of the carbon layer., and strengthen the surfaces due to their bonding characteristics.

The plasma mixture further can include oxygen or nitrogen, leading to formation of tetrafluoromethylaldehyde and tetrafluoroaminomethane. These constituents, as well, provide solid lubricants and substantially improve the surface toughness of the carbon coating.

The fluorinating step further substantially enhances surface smoothness of the carbon layer, by a combined etching of surface peaks by argon ions or other inert component of the mixture, together with implantation of carbon and fluorine ions within the micro-pores, defects, valleys and adjoining molecules of the surface. The ion implantation, together with the formation of extended chain fluoropolymers, substantially enhances the strength and toughness of the carbon layer and enhances its elasticity, resulting in better damping characteristics.

A further aspect of the present invention is a process for treating an exposed surface of a slider body formed of a ceramic material. With the slider body in a plasma chamber, an inert gas plasma is maintained in the chamber to etch the slider substantially in the manner described in connection with the recording medium. Following etching, a plasma mixture is maintained within the chamber at a pressure substantially less than atmospheric pressure and at about 100° C., and for a selected amount of time to enable ion implantation to at least a selected depth. The plasma mixture consists essentially of $CF_4$ and an inert gas, with the $CF_4$ comprising at least sixty percent of the mixture by volume.

As a result of this treatment, a fluoropolymeric thin film is formed along the exposed surfaces of the slider. Ion implantation substantially increases the cohesive bonding strength of the ceramic material molecules throughout the film and deep into the substrate. Moreover, it is believed that extended chain polymers such as hexafluoroethane are formed along the slider surface to improve lubricity. Further polymeric solid lubricants are believed to be formed, depending on the ceramic: e.g. calcium fluoride when sliders include calcium titanate or calcium oxide as a constituent, and titanium tetrafluoride for sliders composed at least partially of calcium titanate or titanium oxide. Lubricants formed in the case of nickel zinc and aluminum oxide sliders are believed to include nickel difluoride and aluminum trifluoride, respectively.

The fluorine ions react with the surface and form a carbon-fluorine film which reduces surface energy and therefore reduces debris pick-up by the slider. Fewer particles are generated due to the increased impact strength and better lubricity of media and slider surfaces. Reduced friction also means reduced noise due to friction, for an enhanced data signal. Accordingly, employing the disclosed processes lead to reduced incidents of head crash for longer useful life of the data storage system, and further enhance signal quality.

IN THE DRAWINGS

For a better appreciation of the foregoing and other features and advantages, reference is made to the following detailed description and drawings, in which.

DETAILED DESCRIPTION OF THE PREFERRED EMBODIMENTS

Figure 1:
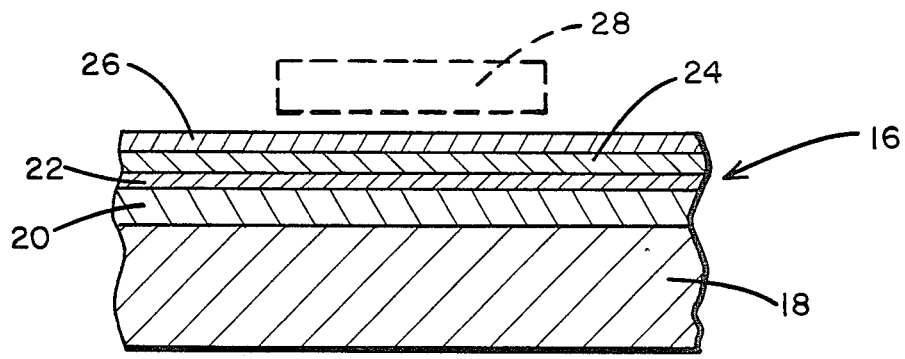
FIG. 1 is a sectional view of part of a magnetic data storage disc provided with a known carbon overcoat.

Turning now to the drawings, there is shown in FIG. 1 a section of a magnetic data storage disc 16, formed by selectively layering a substrate 18 preferably formed of aluminum. A layer 20 consists of nickel, plated on substrate 18 by an electroless process. Nickel layer 20 has a high degree of surface roughness and therefore is polished to a thickness of approximately 400 micro inches (i.e. $10^5$ Angstroms). Next, a layer 22 of chrome is deposited on the nickel layer by sputtering, to a thickness of about 10 Angstroms. A recording layer 24 then is sputtered onto the chrome layer, to a thickness of about 200–300 Angstroms. Recording layer 24 is formed of a magnetizable material typically including nickel/iron and nickel/cobalt alloys, which also may include chrome. In lieu of sputtering, recording layer 24 in some cases is formed by plating. Finally, a carbon layer 26 having a thickness of about 300–400 Angstroms is deposited onto the recording layer by sputtering.

Carbon layer 26 is provided to protect recording layer 24 against corrosion, and also to provide lubricity, thereby to reduce friction between disc 16 and a slider 28 of a magnetic data transducing head. Slider 28 is shown in its normal operating position, supported approximately 10 micro inches above the disc by an air foil generated by disc rotation. Thus, while surface contact friction is not present during operation, repeated starting and stopping of the disc involves slider/disc contact, such that friction can damage slider 28, disc 16 or both.

In addition to providing corrosion protection and lubrication, carbon layer 26 should be as smooth as possible to provide the desired narrow air foil gap or flying height. The utility of a data storage system employing disc 16 and slider 28 resides largely in the density of data storage. Generally, density increases as the gap between slider 28 and recording layer 24 is reduced. Therefore, it is advantageous to minimize the thickness of carbon layer 26 as well as the flying height.

Figure 2:
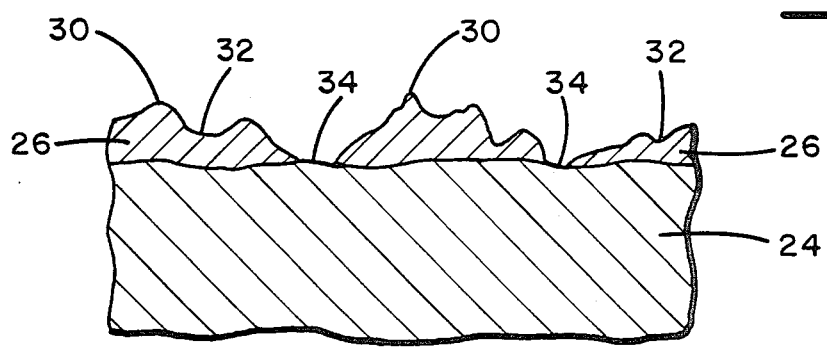
FIG. 2 is an enlarged partial view of FIG. 1.

As seen from the enlarged view in FIG. 2 showing only layers 24 and 26, outer layer 26 of carbon is not smooth, but forms numerous peaks 30, depressions or valleys 32, and pinholes 34 which leave recording layer 24 exposed to damage, particularly due to moisture. Depositing a sufficient thickness of carbon to remove pinholes 34 increases the thickness of the carbon layer and therefore undesirably enlarges the gap between the slider and recording layer. Of course, the flying height of slider 28 must be sufficient to avoid peaks 30, and therefore the effective thickness of carbon layer 26 is equal to the height of the peaks.

The surface roughness of carbon layer 26 contributes to the friction between the disc and slider. Furthermore the carbon layer, particularly at peaks 30, is susceptible to fretting or fracturing from disc/slider contact. The result is a build-up of debris consisting mainly of carbon particles, which are picked up by the slider. Build-up of such debris on the slider eventually leads to a head crash.

Figure 3:
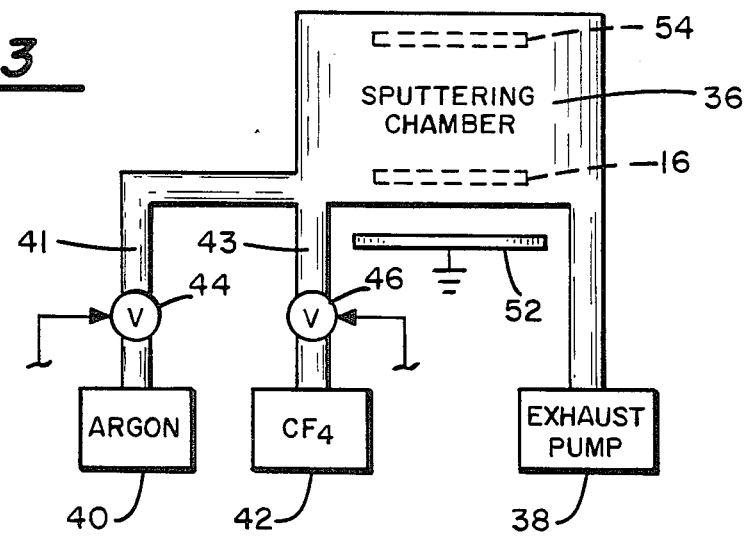
FIG. 3 is a schematic representation of a plasma treatment apparatus.

To smooth and toughen carbon layer 26 and to improve its lubricity, disc 16 is treated with apparatus including a fluid tight plasma chamber 36 schematically illustrated in FIG. 3. While just disc 16 is shown in the chamber, it is to be understood that chamber 36 can be of a sufficient size to accommodate many discs.

The apparatus further includes an exhaust pump 38 in fluid communication with chamber 36 for evacuating the chamber when desired. Also in fluid communication with the chamber, through lines 41 and 43 respectively, are first and second containers 40 and 42. Containers 40 and 42 respectively comprise a supply of an inert gas such as argon, and a reactive gas such as carbon tetrafluoride ($CF_4$) Other gases can be used, e.g. fluorine ($F_2$) as the reactive gas and nitrogen or oxygen in lieu of argon. Valves 44 and 46 control, respectively, the supply of argon and CF₄ to the chamber. A power supply 48 biases an electrode 50 with respect to a grounded electrode 52 to generate the electrical field necessary to ionize gases contained in chamber 36.

To treat disc 16, exhaust pump 38 is actuated to substantially evacuate chamber 36. After evacuation, valve 44 is opened to supply argon to the chamber, with none of the reactive gas being supplied at this point. Argon is supplied to the chamber until pressure within the chamber is about 250 millitorr. Then, power at six hundred watts is supplied to electrode 50 to generate an electrical field and ionize the argon, forming an argon plasma within chamber 36. Etching/cleaning proceeds at a temperature of about 100° C. commonly referred to as low temperature plasma.

The argon plasma is maintained in the chamber for approximately ten minutes, depending upon the load. The argon plasma cleans and etches the exposed surfaces of carbon layer 26, particularly in removing or diminishing peaks 30. This etching process, however, has the undesirable effect of increasing the surface energy of the carbon layer.

Accordingly, disc 16 is subject to a further plasma process. Chamber 36 again is evacuated, whereupon valves 44 and 46 are opened to permit a mixture of argon and CF₄ to enter the chamber. Valves 44 and 46 are controlled, either in the comparative length of time degree to which they are opened, to provide a mixture which is at least sixty percent, by volume, of CF₄. Preferably the percentage of reactive gas is in the range of seventy-five to eighty-five percent, with a particularly preferred mixture being eighty percent CF₄ and twenty percent argon. The argon and CF₄ are permitted to enter the chamber until pressure within the chamber is in the range of from 200–400 millitorr, and preferably at about 350 millitorr. In general, higher pressure enhances ion penetration, while lower pressure improves plasma flow. Power at six hundred watts is supplied to electrode 50, and the plasma process proceeds at approximately 100° C. The preferred exposure time has been found to be twenty-five to thirty minutes, depending upon the area and materials.

During this treatment, conditions inside chamber 36 become increasingly favorable for reactions of the fluorine ions with carbon, thus to form extended chain fluoropolymers along and beneath exposed surfaces of carbon layer 26. In particular, when carbon tetrafluoride is the reactive gas, or when fluorine is the reactive gas and after interaction with the carbon layer, one or more of the following reactions is believed to occur:

$$6CF_4 + 2C \rightarrow 4C_2F_6$$

$$CF_4 + C \rightarrow C_2F_4$$

$$2CF_4 + 4C \rightarrow 2C_3F_4$$

Thus, one or more of the above fluoropolymers, namely hexafluoroethane, tetrafluoroethylene and tetrafluoropropylene, are believed formed over the surface of the carbon layer, and into the carbon layer to a depth which increases with the time of exposure in the plasma chamber. In effect, at least a portion of the carbon layer is fluorinated, with that portion of the carbon being altered to a thin film of carbon and extended chain fluoropolymers.

Oxygen or nitrogen can be supplied to chamber 36 in lieu of argon, resulting in the formation of further fluoropolymers, it is believed, in accordance with the following reactions:

$$2CF_4 + O_2 \rightarrow 2CF_4O$$

$$5CF_4 + 2N_2 \rightarrow 4CF_5N + C$$

Thus, the addition of oxygen, preferably at twenty to thirty percent of the plasma mixture by volume, is believed to form tetrafluoromethylaldehyde along the exposed surfaces of carbon layer 26. Similarly, provision of nitrogen at about twenty to thirty percent of the mixture results in formation of pentafluoroaminomethane.

Due to the superior bonding strength of the extended chain fluoropolymers, the fluorinated carbon film has a greater surface fatigue and fretting strength than the untreated carbon layer. Further, fluorinated carbon film reduces slider/disc friction due to improved lubricity, as these polymers act as solid lubricants.

In addition to their part in forming extended chain fluoropolymers, carbon and fluorine ions generated during the plasma process become implanted in the carbon layer, particularly in micro-pores, defects, valleys 32 and pinholes 34, thus filling in the pinholes to provide a positive protection against moisture penetration. In combination with the etching action of the argon in removing or reducing peaks 30, this ion implanting thus tends to smooth the surface carbon layer 26. Yet another benefit of the combined ion implantation and reaction product is a lower surface energy of carbon layer 26, thus reducing the chance of surface contamination, enhancing surface lubricity and preventing corrosion.

Figure 4:
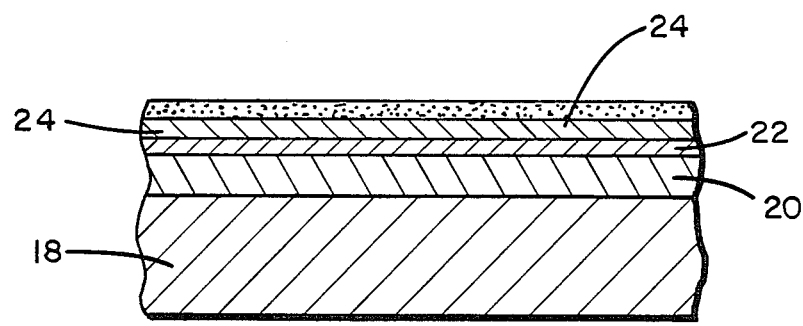
FIG. 4 is a sectional view of the magnetic medium in FIG. 1, after treatment in accordance with the present invention.
Figure 5:
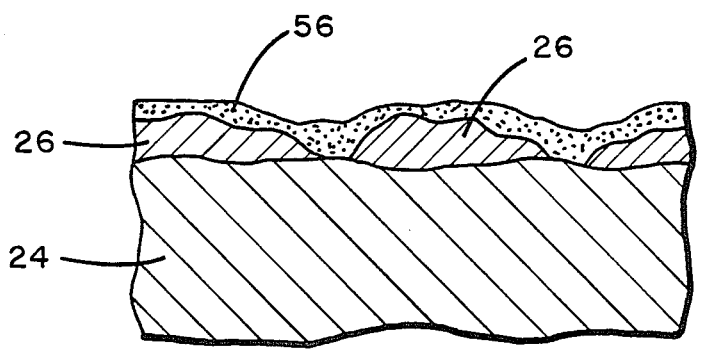
FIG. 5 is an enlarged partial view of FIG. 4.

A segment of disc 16 after treatment is shown in FIG. 4, and in greater detail in FIG. 5. While much of carbon layer 26 remains in its original form, a fluorinated carbon film 56 has formed which consists of carbon and the above-mentioned extended chain fluoropolymers. Asperities or peaks in the original carbon layer have been reduced or removed by the argon etching, while the micro-pores, defects, valleys and pinholes have been at least partially filled by the implantation of ions. Consequently, carbon layer 26 as treated is substantially smoother than the original carbon layer. The overall surface energy is reduced, as the ion implantation and the reaction product film on the surface reduces surface energy and overcomes the tendency of argon etching to increase the surface energy. The increased smoothness of course further reduces friction. The accompanying reduction of noise due to friction enhances the signal generated in the transducing head, in particular the signal to noise ratio. Due to the nature of the bonding of the fluoropolymers, the elasticity and damping characteristics of the surface are also improved.

Figure 6:
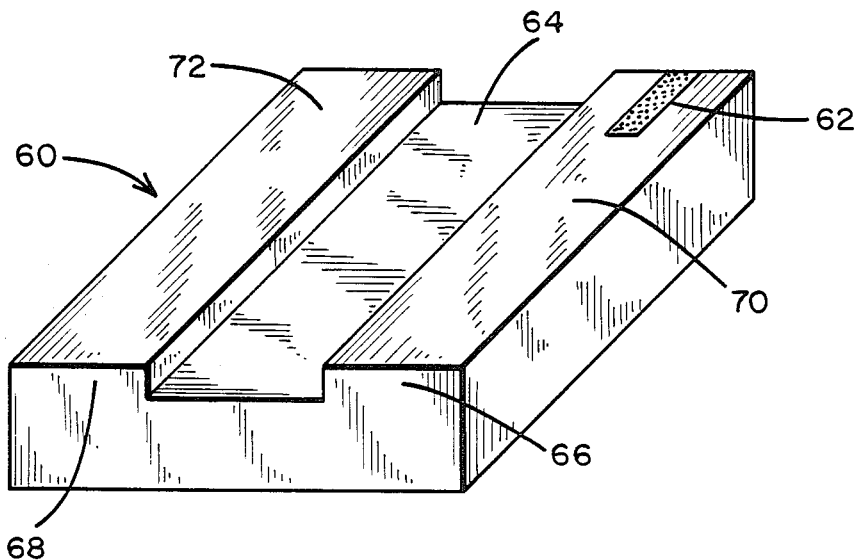
FIG. 6 is a perspective view of a ceramic slider.

FIG. 6 shows a transducing head including a slider 60 and a ferrite core 62 glass bonded on the slider. Slider 60 is of the catamaran type, including a main body 64 and two parallel skis 66 and 68. Top surfaces of the skis 70 and 72 together comprise the interfacing surface of slider 60 which contacts discs such as disc 16 during the starting and stopping of disc rotation. Slider 60 is constructed of a ceramic materials such as calcium titanate, NiZn ferrite, barium titanate, MnZn ferrite and Alsimag (Al₂O₃+TiC).

The surface characteristics of slider 60, particularly along surfaces 70 and 72, can be enhanced by treating slider 60 in processes similar to those described in connection with disc 16. In particular, slider 60 or a multiplicity of similar sliders can be contained in chamber 36 in an argon plasma environment similar to that previously described, except that the time preferred is fifteen to twenty-five minutes.

In the fluorinating process, argon remains the preferred inert gas while the reactive gas is only carbon tetrafluoride.

The process described above in connection with disc 16 can be employed to improve the surface properties of slider 60. More particularly, one or more sliders can be placed in chamber 36 for argon plasma etching, followed by treatment with the plasma gas mixture of argon and carbon tetrafluoride. Again, the $CF_4$ should comprise at least sixty percent of the plasma mixture, with a preferred range being seventy-five to eighty percent and eighty percent being the highly preferred amount. The etching and fluorinating treatment processes both take place at about 100° C. The pressure during fluorinating again is 200–400 millitorr, preferably 350 millitorr.

While the treatment of magnetic media and magnetic head sliders is similar, the desired results in each case occur for different reasons. In particular, formation of extended chain fluoropolymers on the carbon layer of disc 16, improves lubricity, and is a primary benefit of the plasma treatment for media. With sliders, by contrast, the primary benefit of the treatment appears to be the reduced surface energy and increased surface toughness, both of which occur as a result of combined ion implantation and reaction product formation. Consequently, the optimum fluorinating treatment time for sliders is largely a function of the desired depth of ion penetration. Penetration depth has been found to be about 250 Angstroms with an exposure time of forty-five minutes.

Further, however, it has been found for example in the case of calcium titanate sliders and nickel zinc ferrite sliders that the optimum exposure time is about twenty-five minutes. With increased exposure beyond twenty-five minutes, the argon etching effect appears to detrimentally offset the benefits of deposition of a fluorinated layer.

By lowering surface energy, due to combined effect of ion penetration and reaction product film on the surface, the amount of debris pick-up by the slider during normal operation is considerably reduced. This treatment improves the cohesive bonding of the slider ceramic as well, thus increasing the slider surface toughness and reducing friction. All these factors contribute to longer life of the data recording system.

Formation of extended chain fluoropolymers and other polymeric solid lubricant is believed to be present, though not as important a factor as in the case of magnetic media. For example, in the case of a calcium titanate slider, the following reaction is believed to occur:

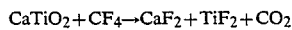

$$CaTiO_2 + CF_4 \rightarrow CaF_2 + TiF_2 + CO_2$$

Figure 7:
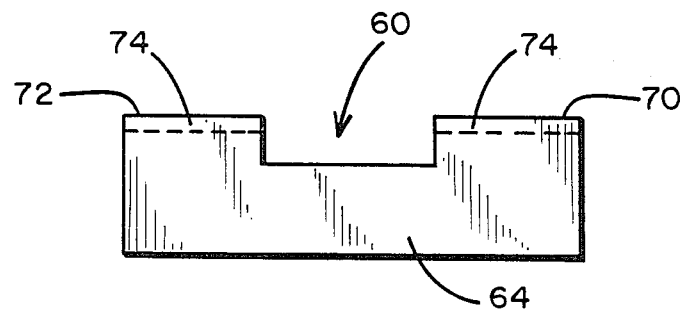
FIG. 7 is an end view of the slider, following treatment in accordance with the present invention.

Thus, as indicated in FIG. 7, the plasma treatment forms a polymerized layer 74 at the surface of slider 60, particularly at surfaces 70 and 72, characterized by ion implantation and formation of extended chain fluoropolymers. The lubricants enhance the lubricity of slider 60. In particular, when a treated slider and a treated disc are used in combination, the friction at low load is reduced by thirty-three to forty percent.

The plasma cleaning and fluorinating treatments, when applied to magnetic media and sliders, substantially enhance the useful life and performance of magnetic data reading and recording devices. The respective treated surfaces show greater strength and toughness, along with lower surface energy and thus a reduced affinity for pick-up of debris. Surface lubricity, particularly for the media, is enhanced by the extended chain fluoropolymers which provide a solid lubricant. Such formation is believed to enhance slider lubricity as well, although the primary improvements in slider surface properties arise from ion penetration.

What is claimed is:

1. A device for storing magnetic data, said device including:
   a substantially rigid substrate;
   a data storage layer consisting essentially of a magnetizable material applied over the substrate;
   an outer layer formed over said data storage layer and consisting essentially of carbon; and
   a polymeric film over said outer layer and consisting essentially of carbon, fluorine ions and extended chain fluoropolymers.

2. The device of claim 1 wherein:
   said extended chain fluoropolymers include one or more of the following constituents: hexafluoroethane, tetrafluoroethylene, and tetrafluoropropylene.

3. The device of claim 2 further including:
   a layer consisting essentially of nickel formed over said substrate and between said substrate and said data storage layer, and a layer of chrome between said nickel layer and said data storage layer.

4. The device of claim 1 wherein:
   said polymeric film is formed over said outer layer by a process which includes the steps of:
   enclosing said substrate, data storage layer and outer layer within a chamber;
   generating and maintaining within the chamber an inert gas plasma at a pressure substantially less than atmospheric pressure, generally at a temperature of about 100° C., and for an amount of time necessary to substantially clean exposed surface areas of the outer layer; and
   following said cleaning, generating and maintaining within the chamber a plasma mixture at a selected pressure substantially less then atmospheric pressure, generally at a temperature of about 100° C. and for a selected amount of time to fluorinate at least a portion of the outer layer, wherein said plasma mixture consists essentially of a reactive gas and an inert gas, with the reactive gas comprising at least sixty percent, by volume, of the mixture and further consisting essentially of at least one of the following constituents: carbon tetrafluoride and fluorine.

* * * * *

UNITED STATES PATENT AND TRADEMARK OFFICE
CERTIFICATE OF CORRECTION

PATENT NO. : 4,863,809

DATED : September 5, 1989

INVENTOR(S) : Amarjit S. Brar and Jagdish P. Sharma

It is certified that error appears in the above-identified patent and that said Letters Patent is hereby corrected as shown below:

Column 8, lines 39 through 62, Claim 4 should read as follows:

4. The device of Claim 1 formed by a process which includes the steps of:

enclosing said substrate, data storage layer and outer layer within a chamber;

generating and maintaining within the chamber an inert gas plasma at a pressure substantially less than atmospheric pressure, generally at a temperature of about 100° C., and for an amount of time necessary to substantially clean exposed surface areas of the outer layer; and

UNITED STATES PATENT AND TRADEMARK OFFICE
CERTIFICATE OF CORRECTION

PATENT NO. : 4,863,809

DATED : September 5, 1989

INVENTOR(S) : Amarjit S. Brar and Jagdish P. Sharma

It is certified that error appears in the above-identified patent and that said Letters Patent is hereby corrected as shown below:

following said cleaning, generating and maintaining within the chamber a plasma mixture at a selected pressure substantially less than atmospheric pressure, generally at a temperature of about 100° C. and for a selected amount of time to form said polymeric film over the outer layer, wherein said plasma mixture consists essentially of a reactive gas and an inert gas, with the reactive gas comprising at least sixty percent, by volume, of the mixture and further consisting essentially of at least one of the following constituents: carbon tetrafluoride and fluorine.

Signed and Sealed this

Twenty-fourth Day of July, 1990

*Attest:*

HARRY F. MANBECK, JR.

*Attesting Officer*      *Commissioner of Patents and Trademarks*